United States Patent
Brankner et al.

(10) Patent No.: US 6,709,793 B1
(45) Date of Patent: Mar. 23, 2004

(54) METHOD OF MANUFACTURING RETICLES USING SUBRESOLUTION TEST PATTERNS

(75) Inventors: Keith Brankner, Austin, TX (US); Charles F. King, Austin, TX (US); Lloyd C. Litt, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 3 days.

(21) Appl. No.: 10/284,836

(22) Filed: Oct. 31, 2002

(51) Int. Cl.[7] .................................................. G03F 9/00
(52) U.S. Cl. ............................................. 430/5; 430/30
(58) Field of Search .................................... 430/5, 30

(56) References Cited

U.S. PATENT DOCUMENTS

| | | |
|---|---|---|
| 5,552,718 A | 9/1996 | Bruce et al. |
| 5,849,440 A | 12/1998 | Lucas et al. |
| 5,900,340 A | 5/1999 | Reich et al. |
| 5,920,487 A | 7/1999 | Reich et al. |
| 6,048,649 A | 4/2000 | Burke et al. |
| 6,171,739 B1 | 1/2001 | Spence et al. |
| 6,218,200 B1 | 4/2001 | Chen et al. |
| 6,228,743 B1 | 5/2001 | Chen et al. |
| 6,324,481 B1 | 11/2001 | Atchison et al. |
| 6,345,210 B1 | 2/2002 | Yu |
| 6,472,108 B1 * | 10/2002 | Lin ................................ 430/5 |
| 6,510,730 B1 * | 1/2003 | Phan et al. ................... 73/105 |
| 2001/0052107 A1 | 12/2001 | Anderson et al. |

* cited by examiner

Primary Examiner—Mark F. Huff
Assistant Examiner—Saleha R. Mohamedulla
(74) Attorney, Agent, or Firm—Robert L. King; Daniel D. Hill

(57) ABSTRACT

A method (100) to manufacture semiconductor reticles associated with a design uses an optical pattern correction (OPC) test pattern (104) in a first reticle frame and having subresolution features that will not resolve or appear on a resulting wafer. A first reticle is made (106) and critical parameters are extracted from the first reticle (108). The critical parameters are used to execute an OPC model (112) to generate a modified design. A production reticle is made from the modified design. The OPC test pattern is placed in a second reticle frame and a second reticle is manufactured. Critical parameters from the second reticle are compared with the critical parameters from the first reticle and must be within a predetermined tolerance or the reticle build process is modified until the tolerance is reached.

15 Claims, 1 Drawing Sheet

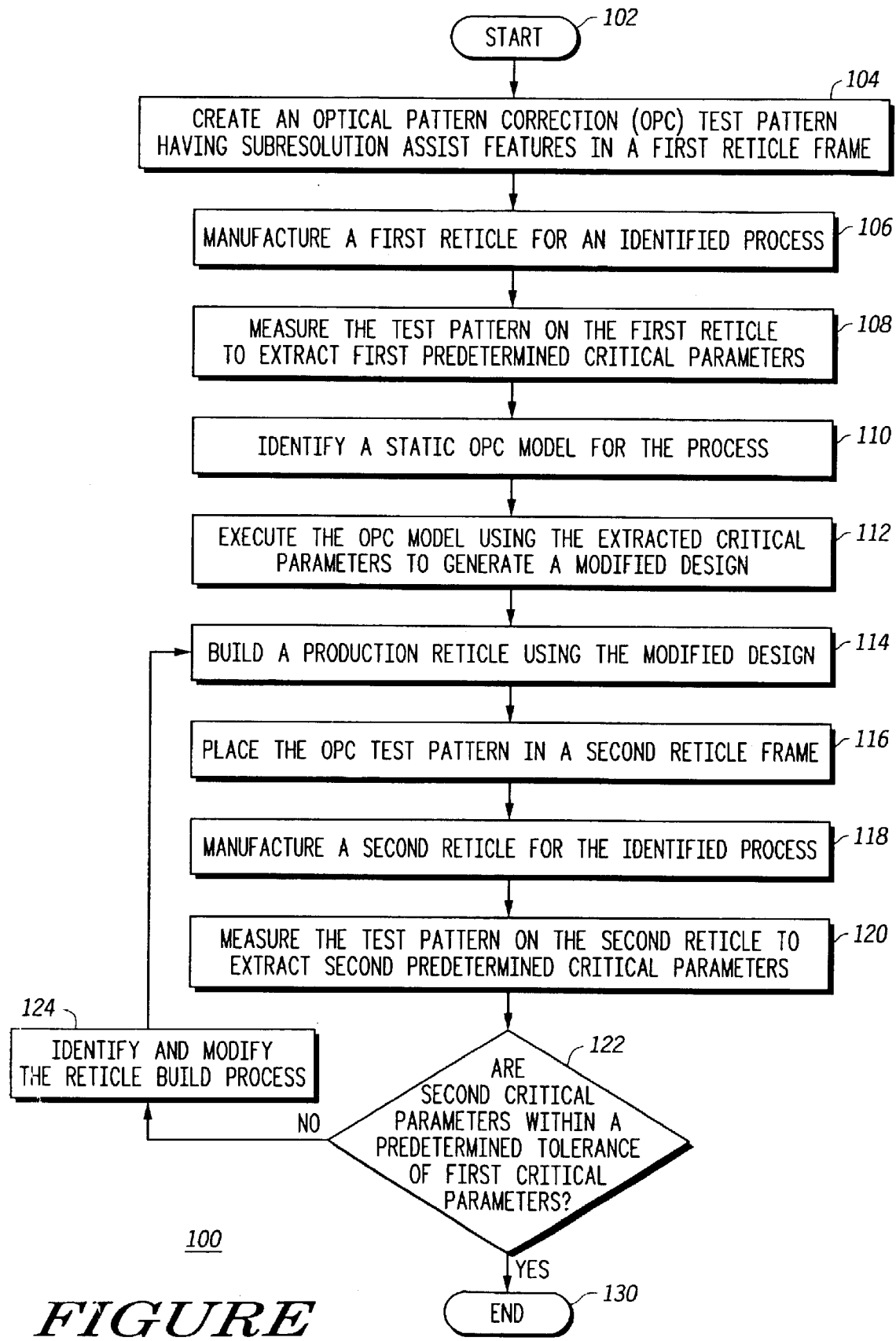
FIGURE

METHOD OF MANUFACTURING RETICLES USING SUBRESOLUTION TEST PATTERNS

CROSS REFERENCE TO RELATED APPLICATION

This application is related to U.S. patent application Ser. No. 10/085,960, entitled "Method for Manufacturing a Lithographic Reticle For Transferring An Integrated Circuit Design to a Semiconductor Wafer And Structure Thereof" filed Feb. 28, 2002, and assigned to the assignee hereof.

FIELD OF THE INVENTION

This invention relates to semiconductor devices, and more particularly to methods for manufacturing semiconductor reticles.

BACKGROUND OF THE INVENTION

Manufacturing of recticles assumes that both the wafer building process and the reticle building process are stable (i.e. the processes do not vary from use-to-use or build-to-build). In reality, no process to manufacture a reticle or a wafer remains consistent. As a result, the critical dimensions of the conductors and semiconductor elements may vary. For printable (wafer level) features, test structures exist that are used to control this variation. No test structures exist, however, for process control using subresolution features where direct control would involve the modification of a process parameter in response to direct measurement of a feature error.

Currently, manufacturers measure the deviation between a feature as drawn in a design and the resulting feature on a semiconductor wafer. If the wafer feature contains dimensional errors, the design is modified. For example, corner serifs are added to modify feature characteristics and this technique is known as an optical proximity correction (OPC) technique. OPC models are constrained to specific reticle manufacturing processes since biasing and feature fidelity are not controlled but assumed stable. With the corrected design, a new reticle is manufactured and then a new wafer is manufactured. This process is iterated until differences between the desired wafer level feature and the actual wafer level feature are acceptable. This iterative process is both time-consuming and expensive.

BRIEF DESCRIPTION OF THE DRAWING

The foregoing and further and more specific objects and advantages of the instant invention will become readily apparent to those skilled in the art from the following detailed description of the invention taken in conjunction with the following drawing:

The sole FIGURE illustrates in flow chart form a method for manufacturing reticles having subresolution test patterns.

DETAILED DESCRIPTION OF THE INVENTION

Illustrated in the sole FIGURE is a method 100 for implementing the manufacture of semiconductor reticles in accordance with the present invention. After a start step 102, an Optical Pattern Correction (OPC) test pattern is created in a step 104 having at least some subresolution assist features in a first reticle frame portion of a first reticle. It should be well understood that the test pattern may additionally have features that are not subresolution and that the OPC test pattern may also be placed in other areas of the reticle rather than the reticle frame. As used herein, the term "subresolution" refers to a feature that does not resolve or appear on a semiconductor wafer that is subsequently manufactured using the manufactured reticle. Features that are intended to be printed on the semiconductor wafer are typically grouped in a center section of the reticle. The reticle frame area typically is near an outer perimeter of the reticle and is the area of a semiconductor reticle that contains features that are not intended to be printed on a semiconductor wafer. The OPC test pattern of step 104 may be generated manually based upon a knowledge of what types of features are common to a targeted design or may be generated by software.

In a step 106 the first reticle is manufactured for an identified process. The identified process is a semiconductor manufacturing process which is known in advance and in which the design rules, lithography limits and characterizations are known. In a step 108, the test pattern is measured on the first reticle to extract one or more first predetermined critical parameters. Examples of the critical parameters are varied. By way of example only, some critical parameters that are extracted include semiconductor line widths and lengths (line width/length), space width/length, pattern areas and pitch dimensions where pitch is defined as a distance between the centers of objects, features or devices, subresolution assist feature offset and isolated feature linearity. Additional parameters include proximity dimensions such as the offset from a feature edge or an area. Other parameters that may be extracted include isolated feature linearity.

In a step 110, a static OPC model is identified for the previously identified process. A static OPC model is an OPC model that does not need to be modified to account for reticle manufacturing process effects such as a wet etch/dry etch and manufacturing process selection (e.g. choice of tools, operating conditions, etc.). In contrast, other OPC models account for process effects by rebuilding the correlation between the designed feature and the manufactured feature to change the model parameters. With model based OPC, a model is generated that simulates the proximity behavior of a particular process, including etch.

In a step 112, the OPC model is executed using the extracted critical parameters to generate a modified integrated circuit design. In a step 114, a production reticle is built or manufactured using the modified integrated circuit design. In a step 116, the OPC test pattern is placed in a second reticle frame. Upon being place in the second reticle frame, a new second reticle is manufactured for the previously identified process in a step 118. In a step 120, the test pattern is measured on the second reticle to extract one or more predetermined second critical parameters to provide one or more extracted second critical parameters. For comparison purposes, the selected extracted second critical parameters are the same parameters as the selected extracted first critical parameters. Once the first critical parameters and the second critical parameters have been obtained, a comparison is performed in a step 122 to determine whether the second critical parameters are within a predetermined tolerance range of the first critical parameters. If the second critical parameters are different enough from the first critical parameters due to process variations in the reticle manufacturing process, a step 124 is performed. In step 124, the reticle build process is identified and modified in a way that will more closely bring or actually bring the next measured critical parameters within the tolerance range. To modify the reticle build process associated with the test pattern results may involve a number of process factors, such as by example, to modify the tool selection used to direct write the pattern into the photoresist or changing the photoresist material and you could also select a different chrome etching process. Other reticle build process modifications include, by way of example only, modifying one or more of data biasing, exposure dose, temperature, developing time, beam size of shape, resist formation, developer formulation and etch biasing. With such reticle build process changes, steps 114, 116, 118, 120 and 122 are again repeated with a new reticle until the most recently extracted critical parameters are within the predetermined tolerance of the first critical parameters. It should be well understood that in an alternative form a predetermined tolerance criteria (i.e. an arbitrary tolerance such as ten percent) may be established to compare with in step 122 rather than using the first predetermined critical parameters. At this point, step 130 ends the reticle build process for multiple reticles. Therefore, a process is herein provided to monitor the manufacture of two or more reticles by ensuring that reticle process variations that may adversely affect the quality of multiple reticles do not become apparent only after wafers have been manufactured and a defect comes to light after significant additional expense.

By now it should be apparent that a method for manufacturing a lithographic reticle has been provided to control OPC feature manufacturing. The test pattern consists of features that are intended not to be printed on a wafer since the small size will not result in an image on the wafer. By using the method disclosed herein, a wafer manufacturer is spared the expense and time of creating multiple revisions of a test wafer and OPC model that may be caused by semiconductor reticle manufacturing errors. As mentioned above, a disadvantage to the previously known processes described in the background section above is that reticle and wafer manufacturing variations are assumed to be static or nonexistent when in fact they are not. Previously such variations were not effectively used as a corrective parameter.

Various changes and modifications to the embodiments herein chosen for purposes of illustration will readily occur to those skilled in the art.

For example, any type of semiconductor device can be manufactured using this method. Various OPC algorithms and implementation engines may be used as long as such OPC implementations are static as explained above. Portions of the method may be implemented in software, such as steps 104, 110 and 122. The optical pattern correction test pattern may contain only subresolution assist features, only resolution assist features or a combination of both types of assist features. To the extent that such modifications and variations do not depart from the spirit of the invention, they are intended to be included within the scope thereof that is assessed only by a fair interpretation of the following claims.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

We claim:

1. A method for manufacturing a lithographic reticle for transferring an integrated circuit design to a semiconductor wafer, the method comprising the steps of:

creating an optical pattern correction (OPC) test pattern having subresolution assist features in a first reticle frame portion of a first reticle;

manufacturing the first reticle;

measuring the optical pattern correction test pattern on the first reticle to extract first critical parameters of the optical pattern correction test pattern and provide extracted first critical parameters;

identifying an OPC model;

executing the OPC model using the extracted first critical parameters to generate a modified integrated circuit design;

building a production reticle using the modified integrated circuit design;

placing the OPC test pattern in a second reticle frame;

manufacturing a second reticle having the second reticle frame;

measuring the OPC test pattern on the second reticle frame to extract second critical parameters and provide extracted second critical parameters; and comparing the extracted second critical parameters to the extracted first critical parameters to determine whether the extracted second critical parameters are within predetermined tolerances.

2. The method of claim 1, wherein the step of comparing further comprises:

determining that the extracted second critical parameters are not within predetermined tolerances; and identifying and modifying a reticle build process to iteratively manufacture a second reticle until the extracted second critical parameters are within the predetermined tolerances.

3. The method of claim 2, wherein the step of identifying and modifying a reticle build process further comprises changing one or more of data biasing, exposure dose, temperature, developing time, beam size or shape, resist formation, developer formulation, etch biasing.

4. The method of claim 1, wherein the extracted first critical parameters of the optical pattern correction test pattern include one or more of line width/length, space width/length, pattern area, pitch, subresolution assist feature offset, and isolated feature linearity.

5. The method of claim 1, wherein the optical pattern correction test pattern comprises only subresolution assist features.

6. The method of claim 1, wherein the OPC model is characterized as being a static OPC model.

7. The method of claim 1, wherein the optical pattern correction test pattern is used to evaluate a reticle build process.

8. A method for manufacturing a lithographic reticle, comprising the steps of:

creating a test pattern having subresolution assist features in a first reticle;

manufacturing the first reticle;

measuring the test pattern on the first reticle to extract a first critical parameter of the test pattern and provide an extracted first critical parameter;

generating a modified integrated circuit design based on the extracted first critical parameter;

building a production reticle using the modified integrated circuit design;

placing the lest pattern in a second reticle;

manufacturing the second reticle;

measuring the test pattern on the second reticle to extract a second critical parameter and provide an extracted second critical parameter; and comparing the extracted second critical parameter to the extracted first critical parameter and as a result of comparing, determining that the extracted second critical parameter is within a predetermined tolerance.

9. The method of claim 8, wherein the step of generating a modified integrated circuit design based on the extracted first critical parameter further comprises the steps of identifying an optical pattern correction (OPC) model and executing the OPC model using the extracted first critical parameter to generate a modified integrated circuit design.

10. The method of claim 9, wherein the OPC model is characterized as being a static OPC model.

11. The method of claim 8, wherein the step of comparing further comprises:

determining that the extracted second critical parameter is not within a predetermined tolerance; and identifying and modifying a reticle build process to iteratively manufacture a second reticle until the extracted second critical parameter is within the predetermined tolerance.

12. The method of claim 11, wherein the step of identifying and modifying a reticle build process further comprises changing one or more of data biasing, exposure dose, temperature, developing time, beam size or shape, resist formation, developer formulation and etch biasing.

13. The method of claim 8, wherein the extracted first critical parameter of the test pattern may be one or more of line width/length, space width/length, pattern area, pitch, subresolution assist feature offset and isolated feature linearity.

14. The method of claim 8, wherein the test pattern comprises only subresolution assist features.

15. The method of claim 8, wherein the test pattern is used to evaluate a reticle build process.

* * * * *